(12) United States Patent
Ahmadi et al.

(10) Patent No.: US 11,937,403 B2
(45) Date of Patent: Mar. 19, 2024

(54) PROGRESSIVE HEATSINK

(71) Applicant: Lumentum Operations LLC, San Jose, CA (US)

(72) Inventors: Roozbeh Ahmadi, Ottawa (CA); Dean Flockton, Kanata (CA); Doug Cross, Ottawa (CA)

(73) Assignee: Lumentum Operations LLC, San Jose, CA (US)

( * ) Notice: Subject to any disclaimer, the term of this patent is extended or adjusted under 35 U.S.C. 154(b) by 360 days.

(21) Appl. No.: 16/832,869

(22) Filed: Mar. 27, 2020

(65) Prior Publication Data

US 2021/0127524 A1 Apr. 29, 2021

Related U.S. Application Data

(60) Provisional application No. 62/924,897, filed on Oct. 23, 2019.

(51) Int. Cl.
*H05K 7/20* (2006.01)
*H01L 23/367* (2006.01)
*H01S 3/04* (2006.01)

(52) U.S. Cl.
CPC ....... *H05K 7/2039* (2013.01); *H01L 23/3675* (2013.01); *H01S 3/0405* (2013.01)

(58) Field of Classification Search
CPC . H05K 7/2039; H01L 23/3675; H01S 3/0405; F28F 2215/04
See application file for complete search history.

(56) References Cited

U.S. PATENT DOCUMENTS

| | | | | |
|---|---|---|---|---|
| 4,765,397 A * | 8/1988 | Chrysler | ............... | H01L 23/473 257/E23.098 |
| 4,953,634 A * | 9/1990 | Nelson | .................. | H01L 23/473 257/E23.098 |
| 5,915,463 A * | 6/1999 | Romero | ................ | H01L 23/473 174/16.3 |
| 6,118,656 A * | 9/2000 | Wang | ........................ | F28F 3/02 257/E23.103 |
| 6,729,383 B1 * | 5/2004 | Cannell | .................. | H01L 23/473 257/E23.098 |
| 8,154,869 B2 * | 4/2012 | Riebel | ........................ | G06F 1/20 165/185 |
| 8,335,081 B2 * | 12/2012 | Weiss | ...................... | H05K 7/209 361/710 |
| 9,472,488 B2 * | 10/2016 | Gohara | ...................... | F28F 3/00 |
| 2003/0131973 A1 * | 7/2003 | Nair | ...................... | H01L 23/367 257/E23.105 |
| 2003/0178181 A1 * | 9/2003 | Noda | ...................... | F28F 13/14 257/E23.099 |
| 2012/0014063 A1 * | 1/2012 | Weiss | ..................... | H05K 13/00 361/697 |

(Continued)

FOREIGN PATENT DOCUMENTS

| CN | 207927116 U | * | 9/2018 | |
|---|---|---|---|---|
| CN | 208044515 U | * | 11/2018 | |
| CN | 210381736 U | * | 4/2020 | ......... H05K 7/20172 |

*Primary Examiner* — Jon T. Schermerhorn, Jr.
(74) *Attorney, Agent, or Firm* — Harrity & Harrity, LLP

(57) ABSTRACT

A heatsink may include a base and a plurality of fins, configured to be disposed in an air flow, that extend orthogonally from the base. The plurality of fins may have at least one of a height, an inter-fin spacing, or a thickness that varies in a direction of the air flow.

20 Claims, 6 Drawing Sheets

(56) References Cited

U.S. PATENT DOCUMENTS

| | | | | |
|---|---|---|---|---|
| 2014/0014308 | A1* | 1/2014 | Wu | H05K 7/20409 165/185 |
| 2014/0311725 | A1* | 10/2014 | Balasubramanian | H01L 23/473 165/168 |
| 2014/0321061 | A1* | 10/2014 | Moore | B32B 27/281 361/709 |
| 2015/0107801 | A1* | 4/2015 | Campbell | H05K 7/2039 165/104.19 |
| 2015/0241142 | A1* | 8/2015 | Vallee | F28F 3/027 165/185 |
| 2015/0318757 | A1* | 11/2015 | Cezario | F28F 3/02 310/52 |
| 2015/0361922 | A1* | 12/2015 | Alvarez | F28D 9/0081 165/185 |
| 2017/0241721 | A1* | 8/2017 | Liang | F28F 3/048 |
| 2019/0200479 | A1* | 6/2019 | Yatskov | H01L 23/3672 |
| 2019/0353431 | A1* | 11/2019 | Ben-Menahem | F28D 15/046 |

\* cited by examiner

PROGRESSIVE HEATSINK

RELATED APPLICATION

This application claims priority to U.S. Provisional Patent Application No. 62/924,897, filed on Oct. 23, 2019 and entitled "PROGRESSIVE HEATSINK FOR PUMP LASERS," the content of which is incorporated by reference herein in its entirety.

TECHNICAL FIELD

The present disclosure relates to heatsinks and, more particularly, to a progressive heatsink for heat-generating devices disposed along a direction of an air flow.

BACKGROUND

A heatsink is a passive heat exchanger that transfers heat generated by an electronic device to a fluid medium, such as air or a liquid coolant. In the fluid medium, the heat generated by the device is dissipated away, thereby allowing regulation of the device's temperature.

SUMMARY

According to some implementations, an apparatus may include a heatsink including a plurality of fins configured to be disposed in an air flow; and a plurality of heat-generating devices in thermal communication with the heatsink and disposed along a direction of the air flow, the heatsink configured to provide a heat dissipation that varies along a length of the heatsink in the direction of the air flow.

According to some implementations, an apparatus may include a heatsink including a plurality of fins configured to be disposed in an air flow; and a plurality of heat-generating devices in thermal communication with the heatsink and disposed along a direction of the air flow, the heatsink configured to maintain a temperature difference between a first heat-generating device of the plurality of heat-generating devices and a last heat-generating device of the plurality of heat-generating devices below a threshold value.

According to some implementations, a heatsink may include a base; and a plurality of fins, configured to be disposed in an air flow, that extend orthogonally from the base, the plurality of fins having at least one of a height, an inter-fin spacing, or a thickness that varies in a direction of the air flow.

DETAILED DESCRIPTION

The following detailed description of example implementations refers to the accompanying drawings. The same reference numbers in different drawings may identify the same or similar elements.

A circuit pack, which may be used in a telecommunications system or a data communications system, may include multiple heat-generating devices, such as pump lasers. In some instances, the circuit pack may include a heatsink, in thermal communication with the heat-generating devices, that removes and dissipates heat generated by the heat-generating devices. In addition, the heatsink may be associated with a fan, or similar device, that provides an air flow across the heatsink to facilitate dissipation of the heat. For example, the fan may be included in an equipment shelf or rack in which the circuit pack is mounted.

Due to space constraints of the circuit pack, or other design considerations, the heat-generating devices may be arranged in series along a direction of the air flow. In such cases, downstream heat-generating devices, in the direction of the air flow, may become hotter than upstream heat-generating devices. This is because the air flow transfers heat generated by the upstream heat-generating devices to the downstream heat-generating devices by convection. Moreover, a velocity of the air flow is reduced as the air flow progresses through the heatsink, which may further inhibit cooling of the downstream heat-generating devices.

Accordingly, typical heatsinks that employ a uniform geometry are unable to cool downstream heat-generating devices to the same extent as upstream heat-generating devices. As a consequence, the downstream heat-generating devices may become overheated resulting in damage to the heat-generating devices, a shorter lifetime for the heat-generating devices, damage to other sensitive components in the circuit pack, and/or the like.

Some implementations described herein relate to a progressive heatsink with a non-uniform geometry that provides improved cooling of heat-generating devices disposed along a direction of an air flow. In some implementations, the heatsink includes a plurality of fins that have a non-uniform geometry such that a thermal resistance of the heatsink changes in the direction of the air flow. Thus, the heatsink may be referred to as a progressive heatsink because a heat dissipation of the heatsink increases along a length of the heatsink in the direction of the air flow. As a result, the heatsink provides more cooling to downstream heat-generating devices than upstream heat-generating devices, to thereby maintain respective temperatures of the heat-generating devices within a particular range. In this way, the heatsink reduces or prevents heat damage to the heat-generating devices, reduces or prevents heat damage to components adjacent to the heat-generating devices, improves a lifetime for the heat-generating devices, and/or the like.

Figure 1:
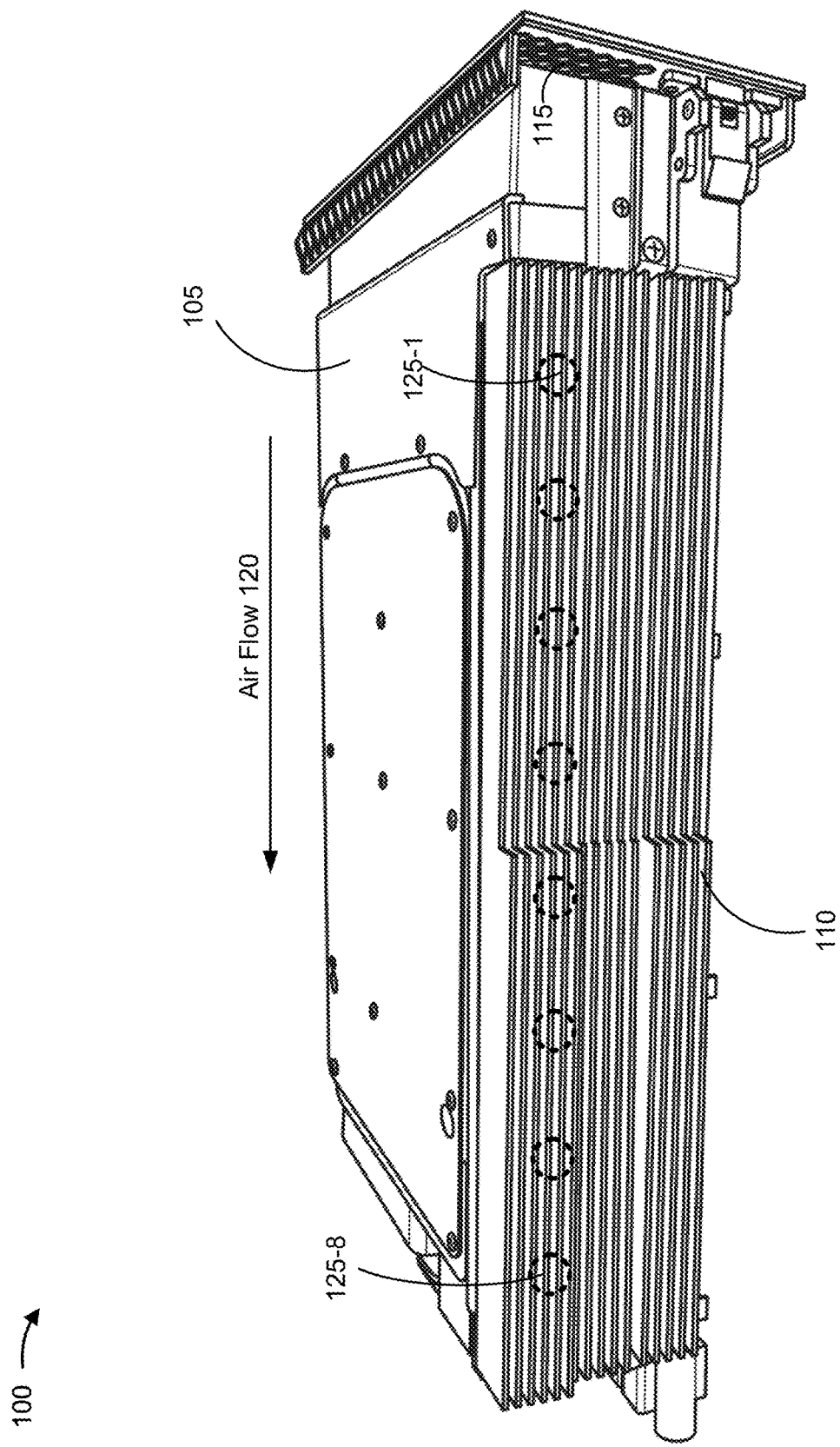
FIG. 1 is a diagram of an example circuit pack described herein.

FIG. 1 is a diagram of an example circuit pack 100 described herein. As shown in FIG. 1, the circuit pack 100 may include a box 105 and a heatsink 110. The heatsink 110 may be positioned along a side of the box 105. The box 105 may include a vent 115 to enable an air flow 120 through the heatsink 110. The air flow 120 may be driven by a fan (not shown), such as a fan included in an equipment shelf or rack in which the circuit pack 100 is mounted. For example, the fan may be located on an opposite side of the heatsink 110 relative to the vent 115. The air flow 120 may flow through fins of the heatsink 110 in a direction (as indicated by the arrow in FIG. 1). For example, the direction may be parallel to a length of the heatsink 110.

The box 105 may include a plurality of heat-generating devices 125-1-125-8 (e.g., disposed in an interior of the box 105). The heat-generating devices 125 may be in thermal communication with the heatsink 110. For example, the heat-generating devices 125 may be attached to a base of the heatsink 110. The heat-generating devices 125 may include devices that generate heat when an electrical current flows through the devices. For example, the heat-generating devices 125 may include one or more pump lasers, one or more transceivers (e.g., small form-factor pluggable transceivers), one or more processors (e.g., central processing units, graphics processing units, digital signal processors), one or more power amplifiers, one or more field-programmable gate arrays, one or more transmitter optical sub-assemblies, one or more receiver optical sub-assemblies, and/or the like.

The heat-generating devices 125 may be disposed in the direction of the air flow 120. That is, the heat-generating devices 125 may be arranged in a series along the length of the heatsink 110. Accordingly, the heat-generating devices 125 may include a first heat-generating device 125-1 that is nearest (among the plurality of heat-generating devices 125) a leading edge of the heatsink 110, a last heat-generating device 125-8 that is nearest (among the plurality of heat-generating devices 125) a trailing edge of the heatsink 110, and optionally one or more intermediate heat-generating devices 125.

The heatsink 110 may be configured to maintain a temperature difference between the first heat-generating device 125-1 and the last heat-generating device 125-8 below a threshold value (e.g., 0.1° C., 1° C., 2° C., or 5° C.). In other words, the heatsink 110 may be configured to maintain respective temperatures of the heat-generating devices 125 within a particular tolerance, such as ±0.1° C., 1° C., or 2° C. In some implementations, the heatsink 110 may be configured to maintain respective temperatures of the heat-generating devices 125 within a particular temperature range, such as 55° C. to 65° C., 58° C. to 62° C., or 50° C. to 75° C. In such cases, the heatsink 110 (e.g., a plurality of fins of the heatsink 110) may have a non-uniform geometry. That is, the heatsink 110 may have a progressive geometry that varies from the leading edge of the heatsink 110 to the trailing edge of the heatsink 110, as described in connection with FIGS. 2A-4C.

As indicated above, FIG. 1 is provided as an example. Other examples may differ from what is described with regard to FIG. 1.

Figure 2A:
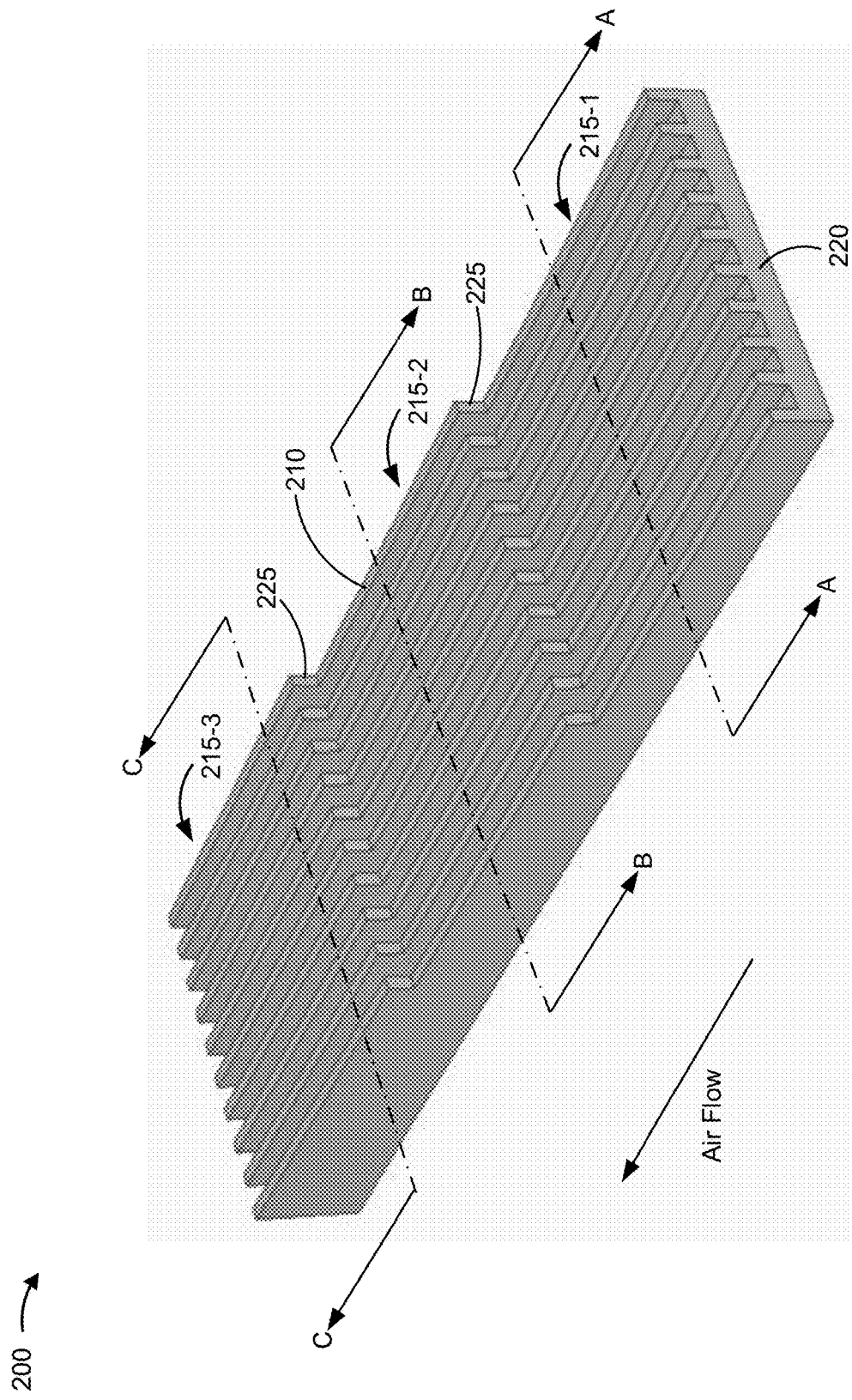
FIG. 2A is a diagram of an example heatsink described herein.

FIG. 2A is a diagram of an example heatsink 200 described herein. The heatsink 200 may be used with the circuit pack 100 of FIG. 1, or with another device or apparatus that includes a plurality of heat-generating devices disposed along a direction of an air flow. The heatsink 200 may be configured to provide a heat dissipation that varies along a length of the heatsink 200 in the direction of an air flow. For example, the heatsink 200 may be configured to provide a first heat dissipation at a leading end of the heatsink 200 (in the direction of the air flow) and a second heat dissipation at a trailing end of the heatsink 200 (in the direction of the air flow), assuming that generated heat is evenly distributed along the length the heatsink 200. The second heat dissipation may be greater than the first heat dissipation. In addition, the heatsink 200 may be configured to provide one or more intermediate heat dissipations between the leading edge and the trailing edge of the heatsink 200.

As shown in FIG. 2A, the heatsink 200 includes a plurality of fins 210 that run along multiple sections 215-1, 215-2, and 215-3 of the heatsink 200. That is, the fins 210 run (e.g., in length) parallel to the length of the heatsink 200 (e.g., in the direction of the air flow). The multiple sections 215 may be sequential in the direction of the air flow. For example, the second section 215-2 may follow the first section 215-1 in the direction of the air flow, and the third section 215-3 may follow the second section 215-2 in the direction of the air flow. The fins 210 extend orthogonally from a base 220 of the heatsink 200, and have a height that is orthogonal to the direction of the air flow.

In some implementations, a fin 210 may include multiple sections, corresponding to the sections 215 of the heatsink 200, and steps 225 between the multiple sections. For example, as shown, the fin 210 may include a first section (corresponding to section 215-1), a second section (corresponding to section 215-2), and a third section (corresponding to section 215-3), with a first step 225 between the first section and the second section and a second step 225 between the second section and the third section. The fin 210 has a first height in the first section, a second height in the second section, and a third height in the third section. The third height may be greater than the second height, and the second height may be greater than the first height. In this way, sections of the fins 210 in the third section 215-3 of the heatsink 200 have a greater surface area (and therefore provide greater heat dissipation) than sections of the fins 210 in the second section 215-2 of the heatsink 200, and the sections of the fins 210 in the second section 215-2 have a greater surface area (and therefore provide greater heat dissipation) than sections of the fins 210 in the first section 215-1 of the heatsink 200.

Moreover, an air flow impedance in the first section 215-1 is less than an air flow impedance in the second section 215-2 (e.g., due to fins 210 having a lesser height in the first section 215-1 than in the second section 215-2), and the air flow impedance in the second section 215-2 is less than an air flow impedance in the third section 215-3. Accordingly, a greater volume of air flow reaches the third section 215-3 relative to a heatsink using a uniform fin height. As a result of the increased air flow (as well as the increased surface area), the third section 215-3 may have a smaller thermal resistance than the second section 215-2 and the first section 215-1.

While FIG. 2A shows the heatsink 200 (and therefore the fins 210) as having three sections, in some implementations, the heatsink 200 (and therefore the fins 210) may have a different quantity of sections, such as two sections or four or more sections with different fin heights per section (or different fin heights in adjacent sections of the four or more sections). In addition, while FIG. 2A shows the sections 215-1, 215-2, and 215-3 as having approximately the same length, the length of the sections may vary from one another.

Moreover, while FIG. 2A shows heatsink 200 as having longitudinal fins 210 that run along the length of the heatsink 200, in some implementations, the heatsink 200 may include another type of fin. For example, the heatsink 200 may include an array of pin fins (e.g., pins having a circle-shaped, a square-shaped, a diamond-shaped, or an oval-shaped cross-section, spline pins, airfoil-shaped pins, and/or the like) that project from a base of the heatsink 200 orthogonally to the direction of the air flow. In this case, a first set of the pin fins, in the first section 215-1 of the heatsink 200, have a first height, a second set of the pin fins, in the second section 215-2 of the heatsink 200, have a second height, and a third set of the pin fins, in the third section 215-3 of the heatsink 200, have a third height. The third height may be greater than the second height, and the second height may be greater than the first height. In this way, the third set of pin fins has a greater surface area (and therefore provides greater heat dissipation) than the second set of pin fins, and the second set of pin fins has a greater surface area (and therefore provides greater heat dissipation) than the first set of pin fins.

As indicated above, FIG. 2A is provided as an example. Other examples may differ from what is described with regard to FIG. 2A.

Figure 2B:
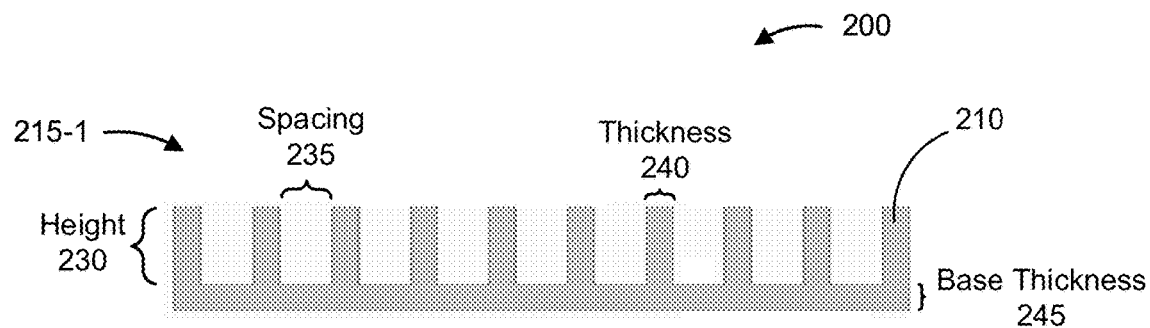
FIG. 2B is a cross-sectional view taken along line A-A of the heatsink of FIG. 2A.
Figure 2C:
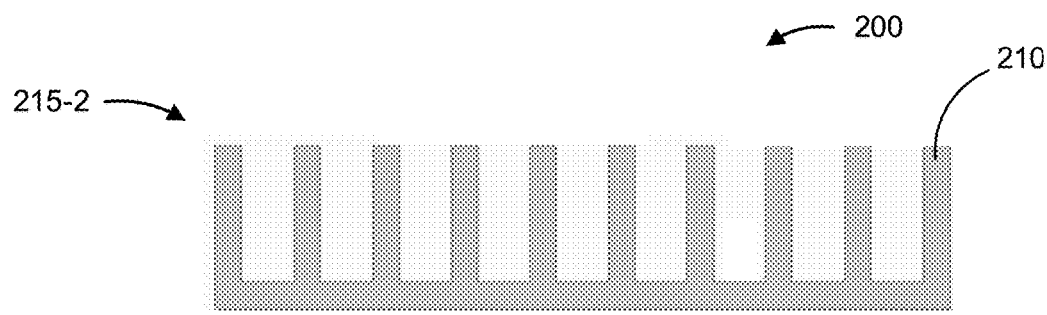
FIG. 2C is a cross-sectional view taken along line B-B of the heatsink of FIG. 2A.
Figure 2D:
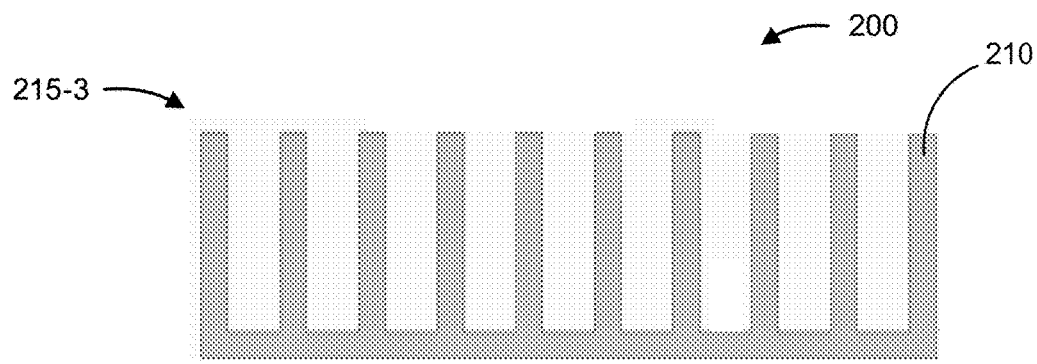
FIG. 2D is a cross-sectional view taken along line C-C of the heatsink of FIG. 2A.

FIGS. 2B-2D are cross-sectional views taken along lines A-A, B-B, and C-C, respectively, of the heatsink 200 of FIG. 2A. Accordingly, FIG. 2B shows a cross-section of the first section 215-1 of the heatsink 200, FIG. 2C shows a cross-section of the second section 215-2 of the heatsink 200, and FIG. 2D shows a cross-section of the third section 215-3 of the heatsink 200.

As shown in FIGS. 2B-2D, and as described above, the fins 210 (or pin fins) may have a first height 230 in a first cross-section (associated with section 215-1 of FIG. 2B) of the heatsink 200, a second height 230 in a second cross-section (associated with section 215-2 of FIG. 2C) of the heatsink 200, and a third height 230 in a third cross-section (associated with section 215-3 of FIG. 2D) of the heatsink 200. As shown, the third height 230 in the third cross-section may be greater than the second height 230 in the second cross-section, and the second height 230 may be greater than the first height 230 in the first cross-section. Accordingly, a surface area of the fins 210 (or pin fins) may be greater in the third cross-section than in the second cross-section, and greater in the second cross-section than in the first cross-section.

The fins 210 (or pin fins) may have the same inter-fin spacing 235 and thickness 240 in the sections 215. In addition, the sections 215 may have the same base thickness 245. In some implementations, one or more of the fins 210 (or pin fins) may have different inter-fin spacings 235 and/or different thicknesses 240 in one or more the sections 215 and/or one or more of the sections 215 may have different base thicknesses 245. For example, the fins 210 (or pin fins) may have a first thickness 240 in the first cross-section, and a second thickness 240 in the second cross-section. As another example, the first cross-section may have a first base thickness 245, and the second cross-section may have a second base thickness 245. In this way, respective heat dissipations of the sections 215 may be tailored to provide temperature uniformity (e.g., within a tolerance) among heat-generating devices.

As indicated above, FIGS. 2B-2D are provided as one or more examples. Other examples may differ from what is described with regard to FIGS. 2B-2D.

Figure 3:
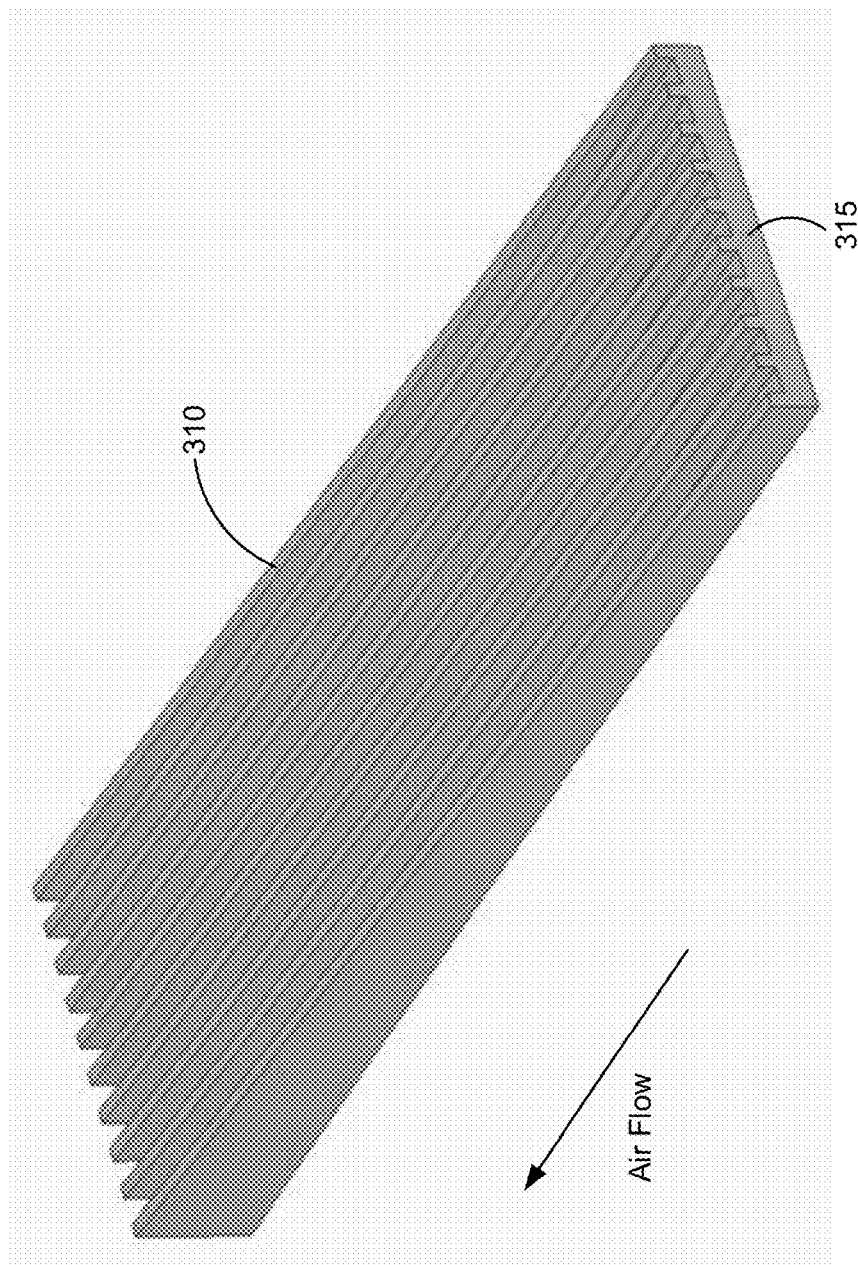
FIG. 3 is a diagram of an example heatsink described herein.

FIG. 3 is a diagram of an example heatsink 300 described herein. The heatsink 300 may be used with the circuit pack 100 of FIG. 1, or with another device or apparatus that includes a plurality of heat-generating devices disposed along a direction of an air flow. The heatsink 300 may be configured to provide a heat dissipation that varies along a length of the heatsink 300 in the direction of an air flow, as described in connection with FIG. 2A.

As shown in FIG. 3, the heatsink 300 includes a plurality of fins 310 that run (e.g., in length) parallel to the length of the heatsink 300 (e.g., in the direction of the air flow). The fins 310 extend orthogonally from a base 315 of the heatsink 300, and have a height that is orthogonal to the direction of the air flow.

In some implementations, a fin 310 may be tapered from a first end of the fin 310 (e.g., associated with the leading edge of the heatsink 300) to a second end of the fin 310 (e.g., associated with the trailing edge of the heatsink 300). In this case, the height of the fin 310 may gradually increase from the first end to the second end of the fin 310. For example, the fins 310 may have a first height in a first cross-section of the heatsink 300, such as shown in FIG. 2B, and the fins 310 may have a second height in a second cross-section of the heatsink 300, such as shown in FIG. 2C or FIG. 2D. In some implementations, a fin 310 may be tapered from a first end of the fin 310 to a second end of the fin 310, such that a width of the fin 310 gradually increases from the first end to the second end of the fin 310.

In this way, a surface area of the fins 310 increases from the first ends to the second ends of the fins 310 (e.g., from the leading edge to the trailing edge of the heatsink 300), and therefore a heat dissipation that can be provided by the fins 310 increases from the first ends to the second ends. Moreover, an air flow impedance of the heatsink 300 decreases from the trailing edge to the leading edge of the heatsink 300, such that a greater volume of air flow reaches the second ends of the fins 310 relative to a heatsink using a uniform fin height. As a result of the increased air flow (as well as the increased surface area), the second ends of the fins 310 may have a smaller thermal resistance than the first ends of the fins 310.

Moreover, while FIG. 3 shows heatsink 300 as having longitudinal fins 310 that run along the length of the heatsink 300, in some implementations, the heatsink 300 may include another type of fin. For example, the heatsink 300 may include an array of pin fins, as described above. In this case, heights of the pin fins may be graduated along the length of the heatsink 300 (e.g., in the direction of the air flow). For example, heights of the pin fins may increase from the leading edge of the heatsink 300 to the trailing edge of the heatsink 300. In this way, a surface area of the pin fins increases from the leading edge to the trailing edge, and therefore a heat dissipation that can be provided by the pin fins increases from the leading edge to the trailing edge.

The fins 310 (or pin fins) may have the same inter-fin spacing and thickness from the leading edge to the trailing edge of the heatsink 300. In addition, the heatsink 300 may have the same base thickness from the leading edge to the trailing edge. In some implementations, one or more of the fins 310 (or pin fins) may have different inter-fin spacings and/or different thicknesses and/or the heatsink 300 may have different base thicknesses from the leading edge to the trailing edge, as described in connection with FIGS. 2B-2D. In some implementations, a combination of the fin height, the inter-fin spacing, the fin thickness, and/or the base thickness may vary from the leading edge to the trailing edge. In this way, heat dissipations of the heatsink 300 may be tailored to provide temperature uniformity (e.g., within a tolerance) among heat-generating devices.

As indicated above, FIG. 3 is provided merely as an example. Other examples may differ from what is described with regard to FIG. 3.

Figure 4A:
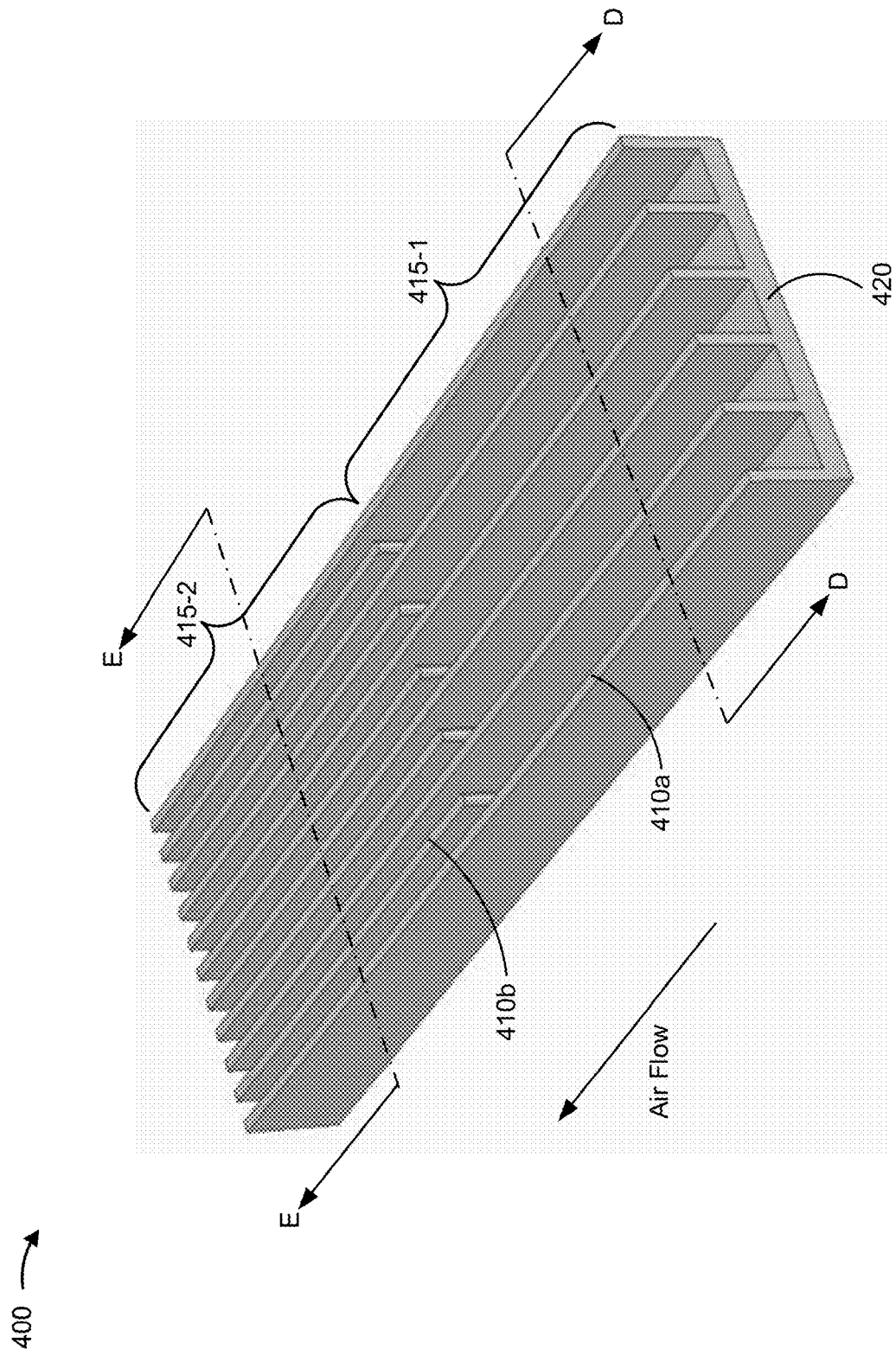
FIG. 4A is a diagram of an example heatsink described herein.

FIG. 4A is a diagram of an example heatsink 400 described herein. The heatsink 400 may be used with the circuit pack 100 of FIG. 1, or with another device or apparatus that includes a plurality of heat-generating devices disposed along a direction of an air flow. The heatsink 400 may be configured to provide a heat dissipation that varies along a length of the heatsink 400 in the direction of an air flow, as described in connection with FIG. 2A.

As shown in FIG. 4A, the heatsink 400 includes a first plurality of fins 410a that run along multiple sections 415-1 and 415-2 of the heatsink 400. The heatsink 400 also includes a second plurality of fins 410b that run along a single section 415-2 of the heatsink 400. In the single section 415-2, the fins 410a and the fins 410b may be configured in an alternating manner (e.g., a first fin may be a fin 410a, a second fin may be a fin 410b, a third fin may be a fin 410a, a fourth fin may be a fin 410b, and so forth). Moreover, a length of a fin 410b may be less than a length of a fin 410a. The fins 410a and 410b run (e.g., in length) parallel to the length of the heatsink 400 (e.g., in the direction of the air flow). The fins 410a and 410b extend orthogonally from a base 420 of the heatsink 400, and have a height that is orthogonal to the direction of the air flow. In addition, the multiple sections 415 may be sequential in the direction of the air flow. For example, the second section 415-2 may follow the first section 415-1 in the direction of the air flow.

In the first section 415-1, the fins 410a have a first inter-fin spacing, and in the second section 415-2, the fins 410a and 410b have a second inter-fin spacing. In other words, adjacent fins 410a have a first inter-fin spacing in the first section 415-1 (and this inter-fin spacing continues into the second section 415-2), and adjacent fins 410a and 410b have a second inter-fin spacing in the second section 415-2. The first inter-fin spacing may be greater than the second inter-fin spacing. Accordingly, a fin density of the heatsink 400 (e.g., a proportion of fin coverage of the base 420 of the heatsink 400) is greater in the second section 415-2 than in the first section 415-1. In this way, the fins 410a and 410b in the second section 415-2 have a greater surface area (and therefore provide greater heat dissipation) than the fins 410a in the first section 415-1. Moreover, an air flow impedance in the first section 415-1 is less than an air flow impedance in the second section 415-2 (e.g., due to a greater inter-fin spacing in the first section 215-1 than in the second section 215-2), such that a greater volume of air flow reaches the fins 410a and 410b in the second section 415-2 relative to a heatsink using a uniform inter-fin spacing. As a result of the increased air flow (as well as the increased surface area), the second section 415-2 may have a smaller thermal resistance than the first section 415-1.

While FIG. 4A shows the heatsink 400 as having two sections, in some implementations, the heatsink 400 may have a different quantity of sections, such as three or more sections with different inter-fin spacings per section (or different inter-fin spacings in adjacent sections of the three or more sections). In addition, while FIG. 4A shows the sections 415-1 and 415-2 as having approximately the same length, the length of the sections may vary from one another.

Moreover, while FIG. 4A shows heatsink 400 as having longitudinal fins 410a and 410b that run along the length of the heatsink 400, in some implementations, the heatsink 400 may include another type of fin. For example, the heatsink 400 may include an array of pin fins, as described above. In this case, a first set of the pin fins, in the first section 415-1 of the heatsink 400, have a first inter-fin spacing, and a second set of the pin fins, in the second section 415-2 of the heatsink 400, have a second inter-fin spacing. The first inter-fin spacing may be greater than the second inter-fin spacing, thereby permitting a greater fin density in the second section 415-2 than in the first section 415-1. In this way, the second set of pin fins has a greater surface area (and therefore provides greater heat dissipation) than the first set of pin fins.

In some implementations, the fins 410a and 410b (or pin fins) are configured (e.g., with inter-fin spacings) such that a velocity of the air flow through the fins 410a and 410b (or pin fins), along the length of the heatsink 400, is maintained within a particular tolerance, such as ±1%, 2%, or 5%. In some implementations, the fins 410a and 410b (or pin fins) are configured (e.g., with inter-fin spacings) such that a velocity of the air flow through the fins 410a and 410b (or pin fins) in the second section 415-2 is greater than a velocity of the air flow through the fins 410a (or pin fins) in the first section 415-1. In this way, the fins 410a and 410b (or pin fins) in the second section 415-2 may provide greater heat dissipation than the fins 410a (or pin fins) in the first section 415-1. In some implementations, one or more blockage panels (not shown) may encase the heatsink 400 (e.g., encase the second section 415-2) to guide the air flow through the fins 410a and 410b (or pin fins) so that the air flow does not bypass the fins 410a and 410b (or pins fins) due to changes in fin density.

As indicated above, FIG. 4A is provided merely as an example. Other examples may differ from what is described with regard to FIG. 4A.

Figure 4B:
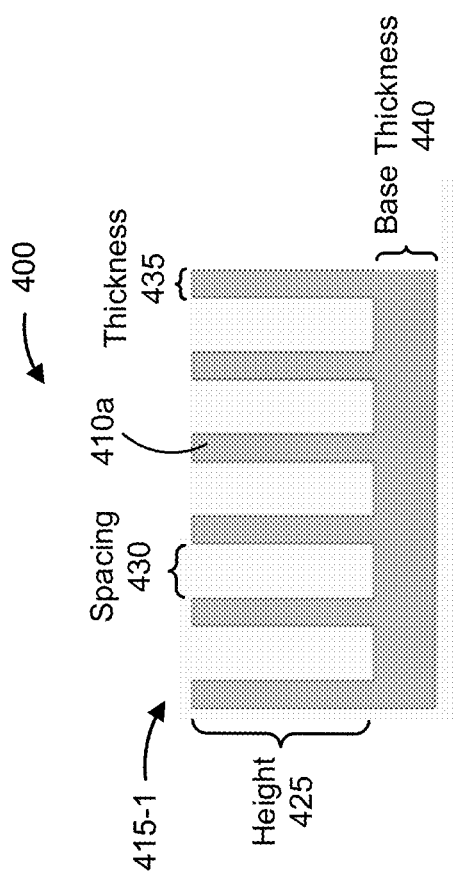
FIG. 4B is a cross-sectional view taken along line D-D of the heatsink of FIG. 4A.
Figure 4C:
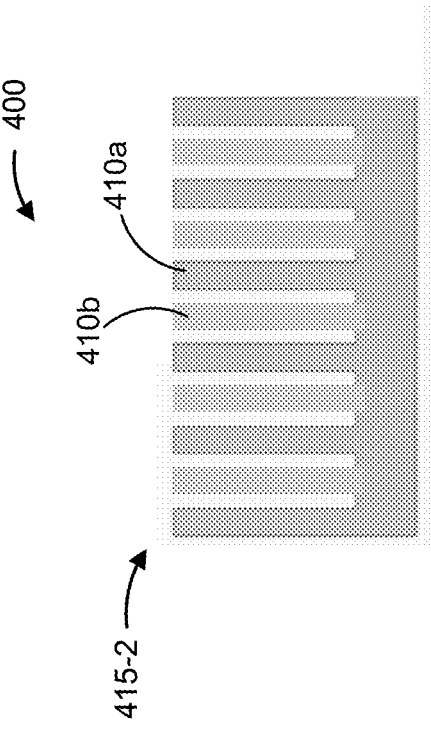
FIG. 4C is a cross-sectional view taken along line E-E of the heatsink of FIG. 4A.

FIGS. 4B and 4C are cross-sectional views taken along lines D-D and E-E, respectively, of the heatsink 400 of FIG. 4A. Accordingly, FIG. 4B shows a cross-section of the first section 415-1 of the heatsink 400, and FIG. 4C shows a cross-section of the second section 415-2 of the heatsink 400.

As shown in FIGS. 4B and 4C, and as described above, an inter-fin spacing 430 of the fins 410a (or pin fins) in a first cross-section (associated with the first section 415-1 of FIG. 4B) of the heatsink 400 may be greater than an inter-fin spacing 430 of the fins 410a and 410b (or pin fins) in a second cross-section (associated with the second section 415-2 of FIG. 4C) of the heatsink 400. Accordingly, a surface area of the fins 410a and 410b (or pin fins) in the second cross-section may be greater than a surface area of the fins 410a (or pin fins) in the first cross-section.

The fins 410a and 410b (or pin fins) may have the same height 425 and thickness 435 in the sections 415. In addition, the sections 415 may have the same base thickness 440. In some implementations, one or more of the fins 410a and/or 410b (or pin fins) may have different heights 425 and/or different thicknesses 435 in one or more of the sections 415 and/or one or more of the sections 415 may have different base thicknesses 440, as described in connection with FIGS. 2B-2D. In this way, respective heat dissipations of the sections 415 may be tailored to provide temperature uniformity (e.g., within a tolerance) among heat-generating devices.

As indicated above, FIGS. 4B and 4C are provided as one or more examples. Other examples may differ from what is described with regard to FIGS. 4B and 4C.

The foregoing disclosure provides illustration and description, but is not intended to be exhaustive or to limit the implementations to the precise forms disclosed. Modifications and variations may be made in light of the above disclosure or may be acquired from practice of the implementations.

As used herein, satisfying a threshold may, depending on the context, refer to a value being greater than the threshold, more than the threshold, higher than the threshold, greater than or equal to the threshold, less than the threshold, fewer than the threshold, lower than the threshold, less than or equal to the threshold, equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. An apparatus, comprising:
   a heatsink including a plurality of fins configured to be disposed in an air flow; and
   a plurality of heat-generating devices in thermal communication with the heatsink and disposed along a direction of the air flow,
   the heatsink configured to provide a heat dissipation that varies along a length of the heatsink in the direction of the air flow,
   at least one fin, of the plurality of fins, having a first surface area in a first cross-section of the heatsink, and a second surface area in a second cross-section of the heatsink,
   the plurality of heat-generating devices being attached to a base of the heatsink on a side of the heatsink opposite the plurality of fins,
   a first set of heat-generating devices, of the plurality of heat-generating devices, are attached opposite a portion of the at least one fin that has the first surface area, and
   a second set of heat-generating devices, of the plurality of heat-generating devices, are attached opposite another portion of the at least one fin that has the second surface area.

2. The apparatus of claim 1, wherein each of the plurality of fins has the first surface area in the first cross-section of the heatsink, and the second surface area in the second cross-section of the heatsink.

3. The apparatus of claim 1, wherein the plurality of fins have a first inter-fin spacing in the first cross-section of the heatsink, and a second inter-fin spacing in the second cross-section of the heatsink.

4. The apparatus of claim 1, wherein a fin, of the plurality of fins, includes a first section and a second section along the direction of the air flow, and a step between the first section and the second section, such that the fin has a first height in the first section and a second height in the second section.

5. The apparatus of claim 1, wherein a fin, of the plurality of fins, is tapered from a first end to a second end of the fin in the direction of the air flow.

6. The apparatus of claim 1, wherein the plurality of fins are pin fins projecting orthogonal to the direction of the air flow.

7. The apparatus of claim 1, wherein the plurality of fins are pin fins projecting orthogonal to the direction of the air flow, and
   wherein heights of the pin fins are graduated in the direction of the air flow.

8. The apparatus of claim 1, wherein the heat-generating devices include one or more pump lasers, transceivers, processors, power amplifiers, field-programmable gate arrays, or optical sub-assemblies.

9. The apparatus of claim 1, wherein the heatsink is positioned along a side of a circuit pack.

10. An apparatus, comprising:
    a heatsink including a plurality of fins configured to be disposed in an air flow; and
    a plurality of heat-generating devices in thermal communication with the heatsink and disposed along a direction of the air flow,
    the heatsink configured to dissipate heat between a first heat-generating device of the plurality of heat-generating devices and a last heat-generating device of the plurality of heat-generating devices,
    at least one fin, of the plurality of fins, having a first surface area in a first cross-section of the heatsink, and a second surface area in a second cross-section of the heatsink,
    the plurality of heat-generating devices being attached to a base of the heatsink on a side of the heatsink opposite the plurality of fins,
    a first set of heat-generating devices, of the plurality of heat-generating devices, are attached opposite a portion of the at least one fin that has the first surface area, and
    a second set of heat-generating devices, of the plurality of heat-generating devices, are attached opposite another portion of the at least one fin that has the second surface area.

11. The apparatus of claim 10, wherein the first cross-section is before the second cross-section in the direction of the air flow, and the first surface area is less than the second surface area.

12. The apparatus of claim 10, wherein the plurality of fins are configured such that a velocity of the air flow through the plurality of fins along a length of the heatsink, in the direction of the air flow, is reduced at a different rate as the air flow progresses along the length of the heatsink, due to a change in surface area of the at least one fin along the length of the heatsink.

13. The apparatus of claim 10, wherein a thickness of the base of the heatsink varies in the direction of the air flow.

14. The apparatus of claim 10, wherein each of the plurality of fins has the first surface area in the first cross-section of the heatsink, and the second surface area in the second cross-section of the heatsink.

15. The apparatus of claim 10, wherein the plurality of fins have a first height in the first cross-section of the heatsink, and a second height in the second cross-section of the heatsink.

16. A heatsink, comprising:
a base;
a plurality of heat-generating devices; and
a plurality of fins, configured to be disposed in an air flow, that extend orthogonally from the base,
  the plurality of fins having at least one of a height, an inter-fin spacing, or a thickness that varies in a direction of the air flow,
  at least one fin, of the plurality of fins, having a first surface area in a first cross-section of the heatsink, and a second surface area in a second cross-section of the heatsink,
  the plurality of heat-generating devices being attached to the base of the heatsink on a side of the heatsink opposite the plurality of fins,
  a first set of heat-generating devices, of the plurality of heat-generating devices, are attached opposite a portion of the at least one fin that has the first surface area, and
  a second set of heat-generating devices, of the plurality of heat-generating devices, are attached opposite another portion of the at least one fin that has the second surface area.

17. The heatsink of claim 16, wherein the plurality of fins are non-uniform.

18. The heatsink of claim 16, wherein the plurality of fins have at least one of:
  a first height in the first cross-section and a second height in the second cross-section,
  a first inter-fin spacing in the first cross-section and a second inter-fin spacing in the second cross-section, or
  a first thickness in the first cross-section and a second thickness in the second cross-section.

19. The heatsink of claim 16, wherein the at least one fin is continuous from the first cross-section of the heatsink to the second cross-section of the heatsink.

20. The heatsink of claim 16, wherein the plurality of fins are pin fins.

\* \* \* \* \*